United States Patent [19]

Inao et al.

[11] Patent Number: 5,382,929
[45] Date of Patent: Jan. 17, 1995

[54] MONOLITHIC CRYSTAL FILTER

[75] Inventors: Kiyohisa Inao; Koji Mizuki; Masaki Kumagai; Takeo Seki, all of Saitama, Japan

[73] Assignee: NDK, Nihon Dempa Kogyo Company, Ltd., Tokyo, Japan

[21] Appl. No.: 101,476

[22] Filed: Aug. 2, 1993

[30] Foreign Application Priority Data

Jul. 31, 1992 [JP] Japan .................. 4-225313
Aug. 31, 1992 [JP] Japan .................. 4-257344
Aug. 31, 1992 [JP] Japan .................. 4-257345

[51] Int. Cl.$^6$ .............................. H03H 9/17
[52] U.S. Cl. .......................... 333/187; 310/344
[58] Field of Search ................ 333/187–192; 310/320, 344, 348–350, 364, 366

[56] References Cited

U.S. PATENT DOCUMENTS

4,511,821  4/1985  Nakamura et al. ............. 310/344 X

FOREIGN PATENT DOCUMENTS

77715  5/1984  Japan ............................ 310/344

*Primary Examiner*—Paul Gensler
*Attorney, Agent, or Firm*—Peter J. Gluck; Vineet Kohli

[57] ABSTRACT

A monolithic crystal filter includes a crystal plate sealed airtight in a vessel. The vessel consists of a metal lid and a main body. The crystal plate is supported a predetermined distance from an insulating substrate. An input electrode and an output electrode are affixed to one surface of the crystal plate. A common electrode is affixed to the other surface of the crystal plate. The insulating substrate has a shield electrode thereon facing the input electrode and output electrode. The shield electrode is grounded to the metal lid of the vessel. An optimal distance between the shield electrode and the input electrode and the output electrode is disclosed for obtaining the best stopband attenuation level. An aluminum electrode island between the crystal plate and an electrode terminal develops an oxide coating which permits relaxation of stress and strain between the electrode island and its associated input and output electrodes to the resulting appropriate bonding strength therebetween. This maintains good frequency/temperature stability of the monolithic crystal filter. Adhesive is applied to one side of the electrode island, overlapping both the electrode island and the crystal plate, to maintain a low value of stress at one side and to maintain proper electric conductivity and raise the shock resistance at the other side.

12 Claims, 8 Drawing Sheets

MONOLITHIC CRYSTAL FILTER

BACKGROUND OF THE INVENTION

The present invention relates to crystal filters, and more particularly, to a monolithic crystal filter to keep a stopband attenuation level at a high level even in a surface installation, and to raise shock resistance with a high electric conductivity. In the present disclosure the test frequency within the stopband is defined as 910 kHz below the center passband $f_0$, i.e. $f_0$-910 kHz. The frequency of $f_0$-910 kHz is equal to the secondary lower image of the common intermediate frequency of 455 kHz in a conventional superheterodyne communications equipment.

A monolithic crystal filter (MCF) is utilized to attain desired bandpass filter characteristics, for example, in communication equipment. A MCF is fabricated in general of a piezoelectric element such as a quartz crystal plate configured in a small package suitable for surface mounting and, the highest attainable stopband attenuation level is required for rejection of undesired signals. The stopband attenuation level, however, is governed mainly by the frequency, the dimensions and the fabricated structure of a MCF. The higher the center frequency, the smaller the size of crystal filter, the more complicated the MCF must be by design. The small size, tends to degrade the stopband attenuation level. The stopband attenuation level is reduced at harmonics of resonant frequency of the MCF. Under this condition, although the output signal level is much lower than the input signal level, the signal experiences less than the desired loss between input and output.

Conversely, the inband attenuation level, or the insertion loss, is determined only by the mechanical vibrational efficiency from input to output through a piezoelectric crystal plate at its resonant passband frequencies. Electrical cascade connection of MCFs have been the heretofore best available means for realizing higher stopband attenuation level.

In a MCF, the stopband attenuation level is degraded due to direct electrical transfer past the gap from a first input electrode to a first output electrode spaced apart on a piezoelectric crystal plate. In addition to direct electric transfer, degradation of the stopband attenuation level is also caused by coupling at spurious resonant frequencies of the crystal plate. Japanese Utility Application Sho 60-118993, Japanese Patent Application Sho 63-273981, Japanese Patent Application Hei 1-83007, and Japanese Patent Application Hei 4-46008 disclose devices for improving the stopband attenuation level, particularly in monolithic crystal resonators suitable for surface mounting.

The above prior art, however, has some drawbacks. The stopband attenuation level varies according to the distance between a first input and a first output electrode of a crystal plate and a shield electrode disposed on an insulating substrate. Japanese Patent Application Hei 4-46008 implies an optimum distance resulting in a desired stopband attenuation level, but the relationship between the distance and the electrical grounding of the shield electrode and a metal lid is not disclosed.

Moreover, in the prior art, the crystal plate, fixed by an adhesive at both sides of the terminals extended form the electrodes, generates substantial strain and stress, thereby causing a change in a frequency/temperature characteristic. The frequency/temperature characteristic is the drift of the center of the passband frequency of a filter due to temperature. In fact, even when the adhesive is applied only on one end of the crystal plate to prevent strain and stress in the longitudinal direction, strain and stress are still generated in the transverse direction. When the adhesive is applied at an outlying point, stress and strain are reduced substantially, but the device has decreased supporting strength. Also, in this case, freedom of the other end of the crystal plate generates bar resonant vibration which may cause breakage of the crystal plate or disconnection of a wiring.

OBJECTS AND SUMMARY OF THE INVENTION

Accordingly, it is an object of the invention to provide a monolithic crystal filter which overcomes the drawbacks of the prior art.

It is a further object of the invention to obtain an optimum stopband attenuation level by adjusting the distance between a crystal plate and an insulating substrate and by connecting a metal lid and a shield electrode on the insulating substrate to a reference voltage such as, for example, a system ground.

It is a still further object of the invention to maintain a good frequency/temperature characteristic, even when the crystal plate is fixed at both of its corners.

It is another object of the invention to prevent degrading electric conductivity at the connection between the terminals extending from electrodes deposited on the crystal plate to the outlying parts and the terminals disposed on the insulating substrate, and simultaneously to improve shock resistance of the MCF device.

Briefly stated, the present invention provides a monolithic crystal filter that includes a crystal plate sealed airtight in a vessel. The vessel consists of a metal lid and a main body. The crystal plate is supported a predetermined distance from an insulating substrate. An input electrode and an output electrode are affixed to one surface of the crystal plate. A common electrode is affixed to the other surface of the crystal plate. The insulating substrate has a shield electrode thereon facing the input electrode and output electrode. The shield electrode is grounded to the metal lid of the vessel. An optimal distance between the shield electrode and the input electrode and the output electrode is disclosed for obtaining the best stopband attenuation level. An aluminum electrode island between the crystal plate and an electrode terminal develops an oxide coating which permits relaxation of stress and strain between the electrode island and its associated input and output electrodes to the resulting appropriate bonding strength therebetween. This maintains good frequency/temperature stability of the monolithic crystal filter. Adhesive is applied to one side of the electrode island, overlapping both the electrode island and the crystal plate, to maintain a low value of stress at one side and to maintain proper electric conductivity and raise the shock resistance at the other side.

According to an embodiment of the invention, there is provided monolithic crystal filter comprising: a crystal plate, a vessel, the crystal plate arranged airtight in the vessel, the crystal plate having a first input electrode and a first output electrode at a first surface, the crystal plate having a common electrode at a second surface, the vessel consisting of a main body and a metal lid, the main body consisting of an insulating substrate, an insulating support, and a welding ring, the insulating substrate having a shield electrode, a second input electrode and a second output electrode at a surface, means for electrically connecting the metal lid to the shield electrode, and an electric conductive adhesive between at least one electrode on one of the crystal plate and the insulating substrate, and the other thereof.

According to a feature of the invention, there is provided a monolithic crystal filter comprising: a crystal plate, a vessel, the crystal plate arranged airtight in the vessel, the crystal plate having a first input electrode and a first output electrode on a first surface thereof, the crystal plate having a common electrode on a second surface thereof, the vessel including a main body and a metal lid, the main body including an insulating substrate, an insulating support, and a welding ting, the insulating substrate having a shield electrode, a second input electrode and a second output electrode on a surface thereof, an electric conductive electrode connected to the shield electrode, means for electrically connecting the metal lid to the electric conductive electrode, the electric conductive electrode passing through the main body, and an electric conductive adhesive between the crystal plate and the insulating substrate.

According to a further feature of the invention, there is provided a monolithic crystal filter comprising: a crystal plate, an input electrode on the crystal plate, an output electrode on the crystal plate, a substrate, means for affixing the crystal plate spaced a predetermined distance from the substrate, and the means for affixing including means for permitting free vibrational motion of the crystal plate with respect to the substrate.

According to a still further feature of the invention, there is provided a monolithic crystal filter comprising: a crystal plate, a shield electrode, means for supporting the crystal plate a predetermined distance from the shield electrode, an insulating support surrounding the crystal plate, a metal lid over the crystal plate, at least one electrode passing through a through-hole in the insulating support, and the at least one electrode connecting the shield electrode to the metal lid.

According to yet another feature of the invention, there is provided a monolithic crystal filter comprising: a crystal plate, a substrate, a shield electrode on a surface of the substrate facing the crystal plate, means for Supporting facing surfaces of the crystal plate and the shield electrode a predetermined distance apart, at least one body of adhesive in the means for supporting, and the at least one body of adhesive taking up at least a portion of the predetermined distance.

According to still another feature of the invention, there is provided a monolithic crystal filter comprising: a crystal plate, a shield electrode, an input electrode on the crystal plate spaced a predetermined distance from the shield electrode, an output electrode on the crystal plate spaced the predetermined distance from the shield electrode, a gap between the input electrode and the output electrode, a first leakage signal passing over the gap between the input electrode and the output electrode, a second leakage signal passing between the shield electrode and the input electrode and the output electrode, the first leakage current being in opposite phase from the second leakage current, and the predetermined distance being established to make the second leakage current equal to the first leakage current, whereby the first leakage current is canceled by the second leakage current, and a maximum stopband attenuation level is attained.

The above and other objects and advantages of the present invention will become apparent from the following description read in conjunction with the accompanying drawings, in which like reference numerals designate the same element.

BRIEF DESCRIPTION OF THE DRAWINGS

FIG. 20(c) is a plan view to show the position of the adhesive on a crystal plate of a monolithic crystal filter according to a modification of the third embodiment of the present invention.

FIG. 20(d) is an enlarged sectional view to show the connection between the crystal plate and the insulating substrate in FIG. 20(c).

DETAILED DESCRIPTION OF THE PREFERRED EMBODIMENT

The inventors have discovered that an aluminum film coating over a metal reduces stress and strain at the contact. It is theorized that a thin oxide aluminum layer, naturally formed on an aluminum surface, may reduce the binding strength at the contact to an appropriate value, but not enough to permit separation. Excessive oxidation may result in poor conductivity at the contact. To solve this problem, an alternate electric connection is created by applying a conductive adhesive overlapping both a terminal of an insulating substrate as well as a terminal of a crystal plate. Otherwise, because the Ag contained in the adhesive material may activate deoxidization, a resulting thin oxide layer formed at the contact of the Cr—Ag mixed film of the terminal does not interfere with conductivity.

An aluminum electrode island between the crystal plate and the insulating substrate develops an oxide coating which permits a release of stress and strain between the electrode island and its associated input and output electrodes. This maintains good frequency/temperature characteristic of the monolithic crystal filter. Adhesive is applied to one side of the electrode island, overlapping both the electrode island and the crystal plate; to maintain a low value of stress at one side and to maintain proper electric conductivity and to raise the shock resistance at the other side.

Figure 1:
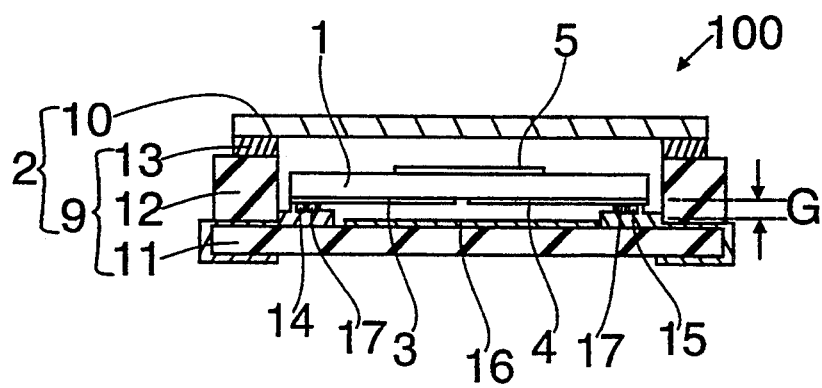
FIG. 1 is a sectional view of a monolithic crystal filter according to the prior art.

Referring to FIG. 1, a monolithic crystal filter 100 in the prior art includes a crystal plate 1 sealed airtight in a vessel 2. Vessel 2 is made up of a concave main body 9 and a metal lid 10. Main body 9 consists of an insulating substrate 11, an insulating support 12 and a welding ring 13. A second input electrode 14 and a second output electrode 15 are disposed on insulating substrate 11. An electric conductive adhesive 17 on each of second input electrode 14 and second output electrode 15 provides mechanical adhesion at the ends of crystal plate 1. A shield electrode 16 is disposed on insulating substrate 11 between second input electrode 14 and second output electrode 15. Second input electrode 14 and output electrode 15 are thicker than a shield electrode 16 to suspend crystal plate 1 a distance G above shield electrode 16.

Figure 2A:
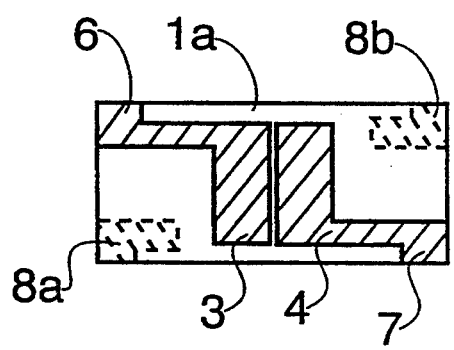
FIG. 2(a) is a plan view of a first surface of a crystal plate of FIG. 1.

Referring now to FIG. 2(a), a first surface 1a of crystal plate 1 has a first input electrode 3 and a first output electrode 4 spaced apart from each other by a gap. An electrode terminal 6 is connected to first input electrode 3. An electrode terminal 7 is connected to first output electrode 4.

Figure 2B:
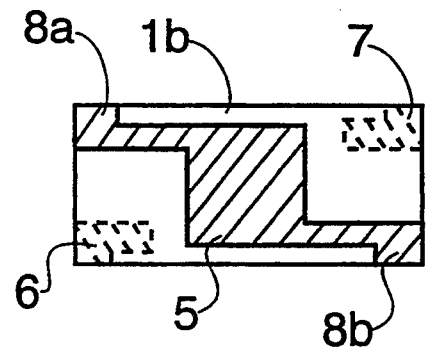
FIG. 2(b) is a plan view of a second surface of the crystal plate in FIG. 1.

Referring now to FIG. 2(b), a second surface 1b of crystal plate 1 has a common electrode 5 centered thereon. An electrode terminal 8a is connected to a first end of common electrode 5. A second electrode terminal 8b is connected to a second end of common electrode 5.

Figure 3:
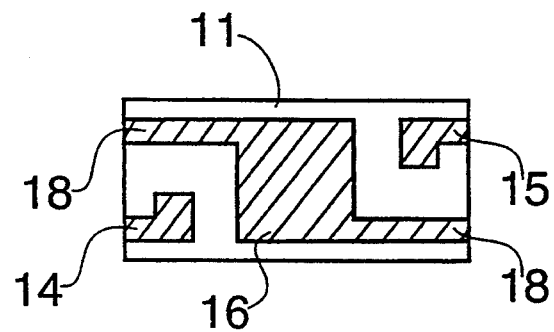
FIG. 3 is a plan view of an insulating substrate in FIG. 1.

Referring now to FIG. 3, shield electrode 16 is centered on insulating substrate 11. A first electrode terminal 18 is connected to a first end of shield electrode 16. A second electrode terminal 18 is connected to the second end of shield electrode 16. Second input electrode 14 is disposed on insulating substrate 11 alongside first electrode terminal 18. Second output electrode 15 is disposed on insulating substrate 11 along second electrode terminal 18.

Crystal plate 1 is mounted with its first surface 1a facing insulating substrate 11. First input electrode 3 contacts second input electrode 14. First output electrode 4 contacts second output electrode 15. Electric conductive adhesive 17 secures these contacting parts together, both electrically and mechanically. Common electrode 5 on the top side of crystal plate 1 is connected to shield electrode 16 by wire bonding from electrode terminals 8a and 8b to corresponding ones of first and second electrode terminals 18.

Figure 4:
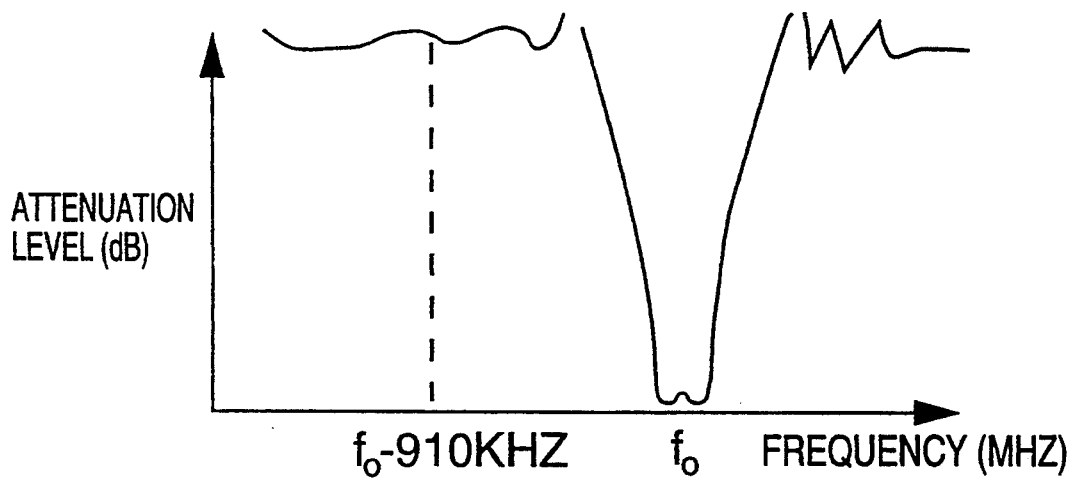
FIG. 4 is a graph to show an attenuation characteristic of a typical monolithic crystal band-pass filter.

Facing the first surface 1a of crystal plate 1 toward shield electrode 16 on insulating substrate 11 prevents leakage of signals due to stray capacitive coupling between first input electrode 3 and first output electrode 4. This reduction in signal leakage improves the stopband attenuation level A (Db), as shown in FIG. 4. The attenuation varies from near zero at the center frequency $f_0$, and increases rapidly on both sides of the center frequency $f_0$. The stopband attenuation level must exceed a specific value (dB) throughout the frequency range outside the passband of the filter. For convenience, the stopband attenuation level is measured at a frequency of, for example, 910 Khz displaced in the lower-frequency direction from the center frequency $f_0$, that is, at the frequency $f_0$-910 kHz.

Figure 5:
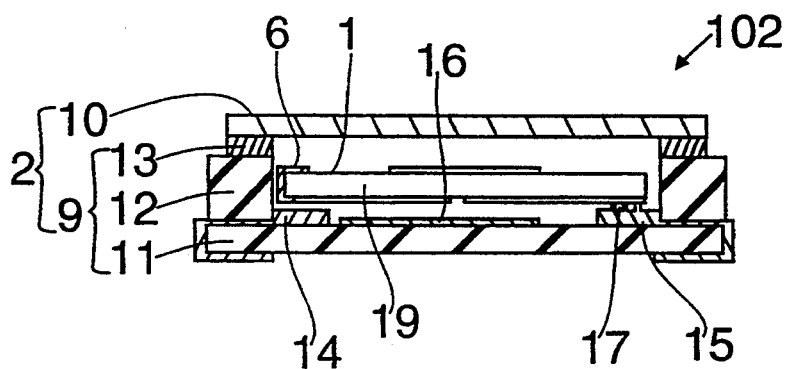
FIG. 5 is a sectional view of a monolithic crystal filter according to a second embodiment of the prior art.

Referring to FIG. 5, a monolithic crystal filter 102 of the prior art includes a crystal plate 1 sealed airtight in a vessel 2. Vessel 2 is made up of a concave main body 9 and a metal lid 10. Main body 9 consists of an insulating substrate 11, an insulating support 12 and a welding ring 13. A second input electrode 14 and a second output electrode 15 are disposed on insulating substrate 11. An electric conductive adhesive 17 on each of second input electrode 14 (not legended) and second output electrode 15 provides mechanical adhesion at the ends of crystal plate 1.

Figure 6A:
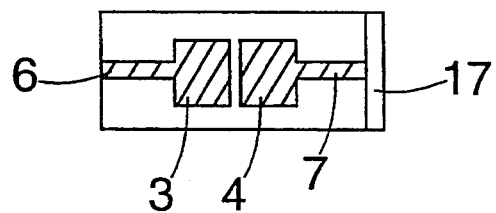
FIGS. 6(a), 6(b), and 6(c) are plan views of the crystal plate of FIG. 5.
Figure 6B:
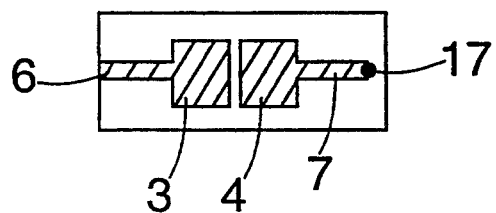
Figure 6C:
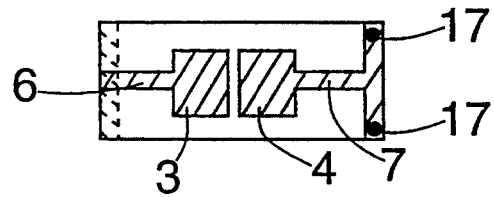

Referring to FIG. 6(a) through FIG. 6(c), plan views of this known embodiment of a monolithic crystal filter are illustrated. In FIG. 6(a) a first input electrode 3 and a first output electrode 4 are shown spaced apart from each other by a gap. An electrode terminal 6 is connected to first input electrode 3. An electrode terminal 7 is shown contacted by an electrically conductive adhesive 17. FIG. 6(b) likewise illustrates an electrode terminal 6 is connected to first input electrode 3. An electrode terminal 7 is connected to first output electrode 4, and electrode terminal 7 is shown contacted by an electrically conductive adhesive 17. In FIG. 6(c) the electrically conductive adhesive 17 appears at two contact points.

Figure 7:
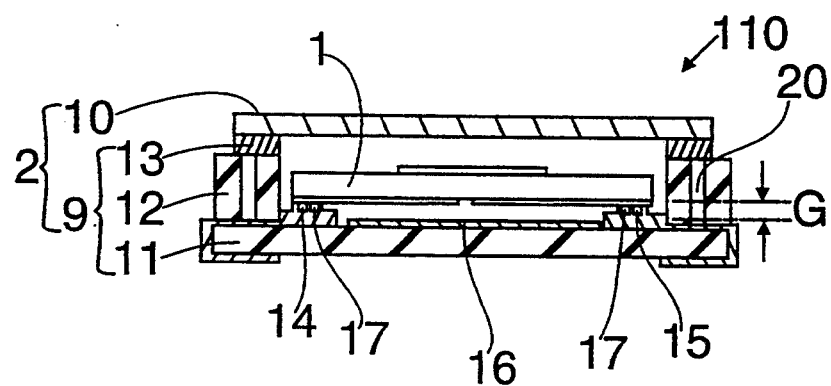
FIG. 7 is a sectional view of a monolithic crystal filter according to a first embodiment of the present invention.

Referring to FIG. 7, a monolithic crystal filter 110 according to an embodiment of the present invention includes crystal plate 1 sealed airtight in vessel 2. As in the prior-art embodiment discussed above, vessel 2 includes concave main body 9 covered by metal lid 10. Main body 9 consists of insulating substrate 11 with insulating support 12 about its perimeter. Sealing ring or welding ring 13 is disposed between the top of insulating support 12 and metal lid 10. Welding ring 13 is an electrically conductive material. A plurality of electric conductive electrodes 20 are formed in through-holes through insulating support 12. Electric conductive electrodes 20 provide electrical connection through welding ring 13 between lid 10 and first and second electrode terminals (not numbered), thereby maintaining lid 10 and shield electrode 16 at the same potential. At least one of first and second terminals (not numbered) is connected to ground potential, thereby maintaining shield electrode 16, welding ring 13 and metal lid 10 at ground potential. These electrical connections are made when monolithic crystal filter 110 is heated during final stages of processing. The remainder of monolithic crystal filter 110 of the present invention is the same as monolithic crystal filter 100 of the prior art illustrated in FIG. 1.

Figure 8:
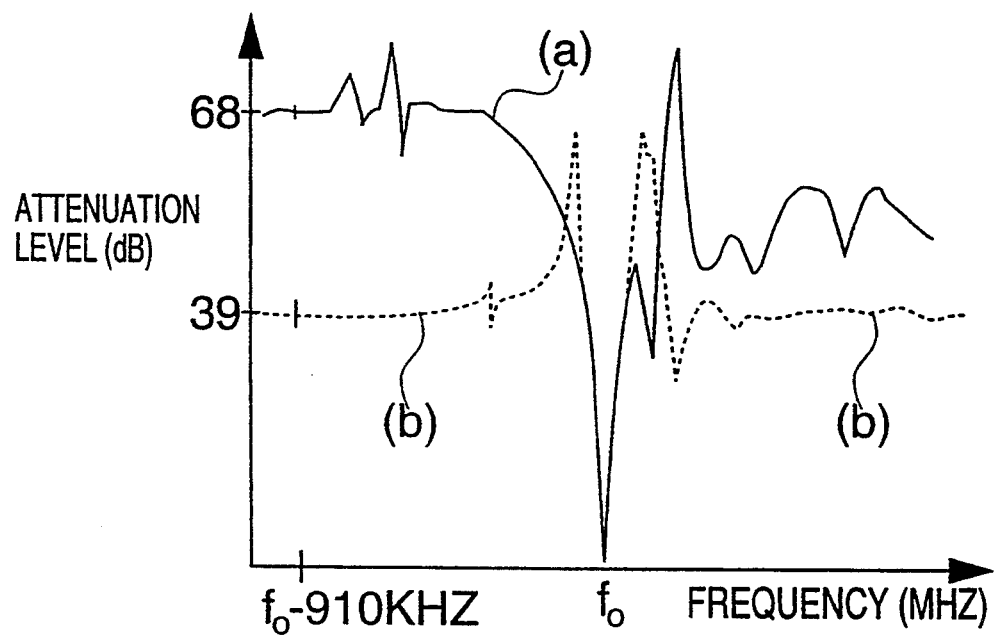
FIG. 8 is a graph to show the attenuation characteristic of the first embodiment of the present invention.

Referring now to FIG. 8, the stopband attenuation level in the monolithic crystal filter of the present invention is 68 dB, as shown in a line (a), whereas the stopband attenuation level in the prior-art embodiment is 39 dB, as shown in a line (b). This improvement of 29 dB is attained due to the improved input/output shielding provided by grounding second input electrode terminal 18, second output electrode terminal 18, and metal lid 10.

The distance G between crystal plate 1 and insulating substrate 11 has a great influence on the stopband attenuation level of a filter having a given center frequency $f_0$.

Figure 9A:
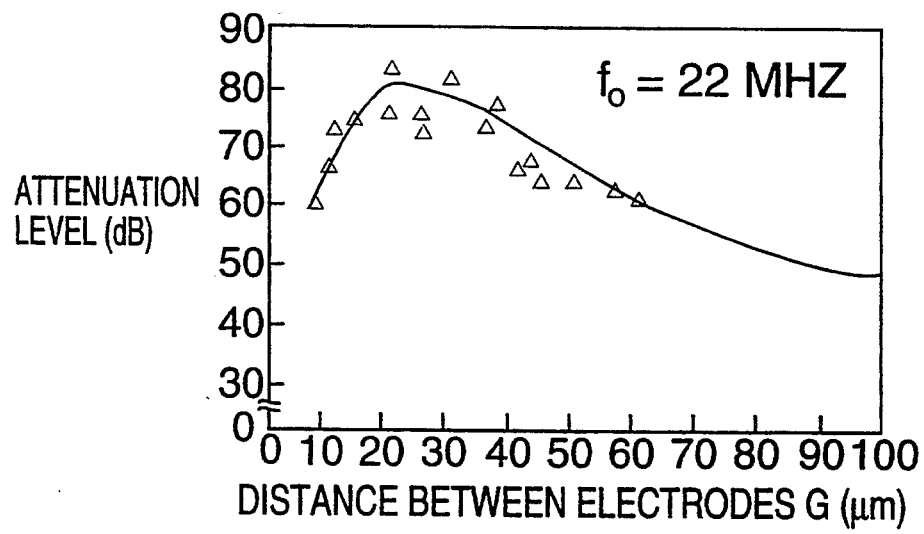
FIGS. 9(a), 9(b), and 9(c) are graphs to which reference will be made in explaining the attenuation characteristic for monolithic crystal filters having their passbands centered on frequencies of 22, 45, or 90 Mhz, respectively.

Referring to FIG. 9(a), with a center frequency $f_0$ of 22 MHz, the stopband attenuation level has a peak value with a spacing equal to a distance G of about 20 μm, and falls off rapidly on the lower range, and falls off more slowly on the higher range.

Figure 9B:
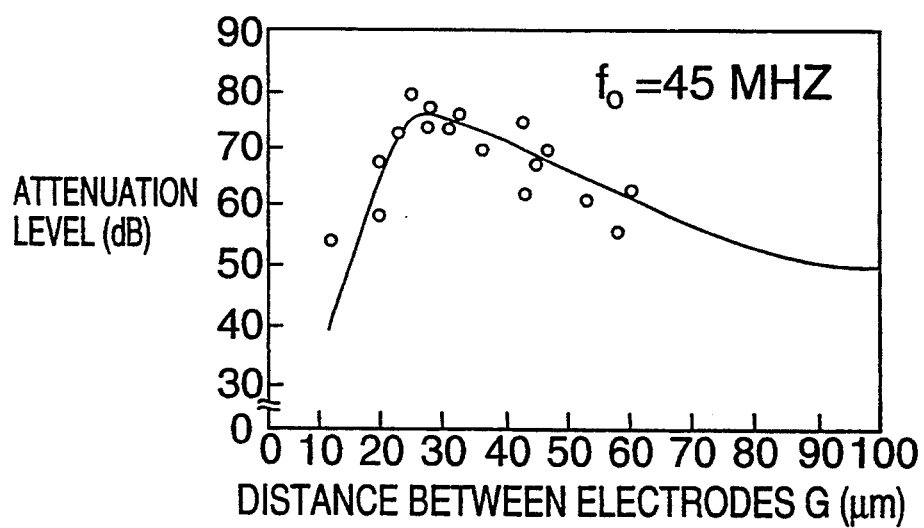

Referring to FIG. 9(b), with a center frequency $f_0$ of 45 MHz, the stopband attenuation level has a peak value with a distance G of about 22 μm, and falls off rapidly on the lower range, and falls off more slowly on the higher range.

Figure 9C:
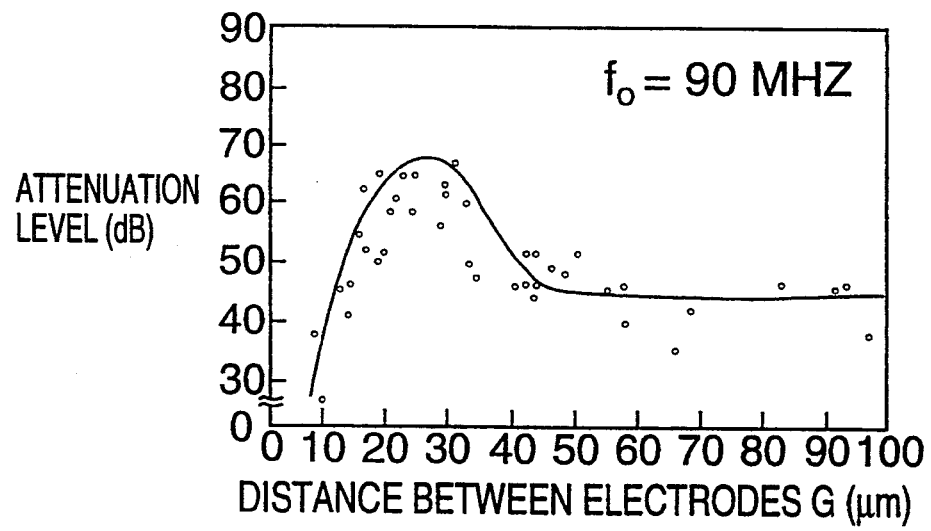

Referring to FIG. 9(c), with a center frequency $f_0$ of 90 MHz, the stopband attenuation level has a peak value with a distance G of about 27 μm, and falls off rapidly in the lower and upper ranges. Above a value of G about 50 μm, the stopband attenuation level falls off more slowly.

Comparing the curves in FIGS. 9(a), 9(b) and 9(c), it will be noted that the maximum value of the stopband attenuation level decreases with increasing frequency. This may be due to the greater likelihood of signal leakage at higher frequencies.

It will be clear from the above disclosure that selecting a distance G between about 15 and 50 μm gives substantial stopband attenuation levels. A more preferred distance G from about 20 to about 30 μm gives near optimum test values of attenuation.

Figure 10:
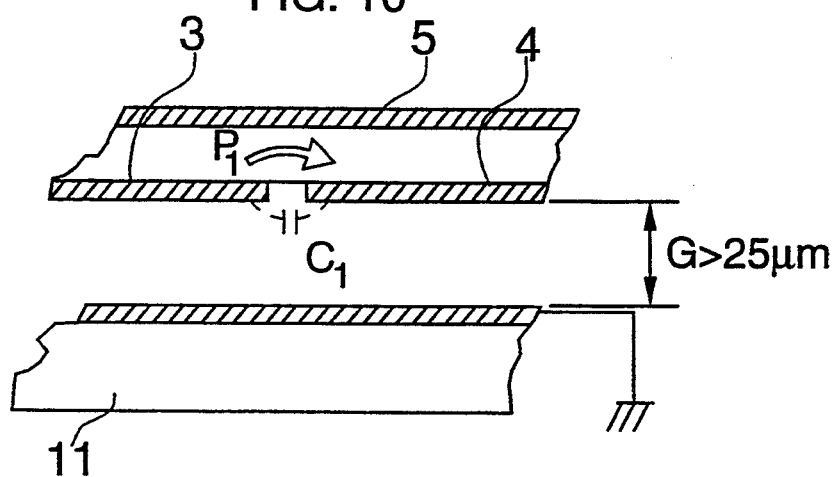
FIG. 10 is an illustration to show the electrical interaction of a crystal plate and an insulating substrate when the distance between them is more than 25 $\mu$m.

Referring to FIG. 10, the mechanism producing the reduction in stopband attenuation level on the high-G side of the peak is shown. Based upon the experimental results, it may be reasonably presumed that the signal leakages occur in the three cases generally at the stopband frequency. As the distance G increases beyond the optimum value, signal leak current P1, resulting from capacitive coupling, increases the leakage signal transferred from first input electrode 3 to first output electrode 4 through crystal plate 1.

Referring now to FIGS. 9a, 9b, 9c and 11, signal leak current P2 flows in the area between input electrode 3 and output electrode 4 and shield electrode (not numbered). This effect is similar to signal transmission in a waveguide or a stripguide. The leak currents P1 and P2 are always out of phase with respect to each other, so that at the optimal distance of approximately 25 μm, P1 and P2 cancel each other, and thereby produce the optimum value of stopband attenuation level. At a distance smaller or larger than the optimum, leak currents P1 and P2 are not equal. That is, P1<<P2 or P1>>P2, and therefore the stopband attenuation level is governed by P2 or P1, respectively, as shown in FIG. 9a, 9b, 9c and 11. However, the stopband attenuation level can be degraded sharply if the stopband frequency happens to coincide with a spurious resonant response of crystal plate 1. This spurious resonant response produces the same result as an inband response due to resonance.

As the distance G increases beyond 25 μm, a leakage signal $P_1$ resulting from capacitive connection ($C_1$) between first input electrode 3 and first output electrode 4 transmitted to shield electrode 16 also increases. This increases the signal leakage between input and output, and thus degrades the stopband attenuation level.

Figure 11:
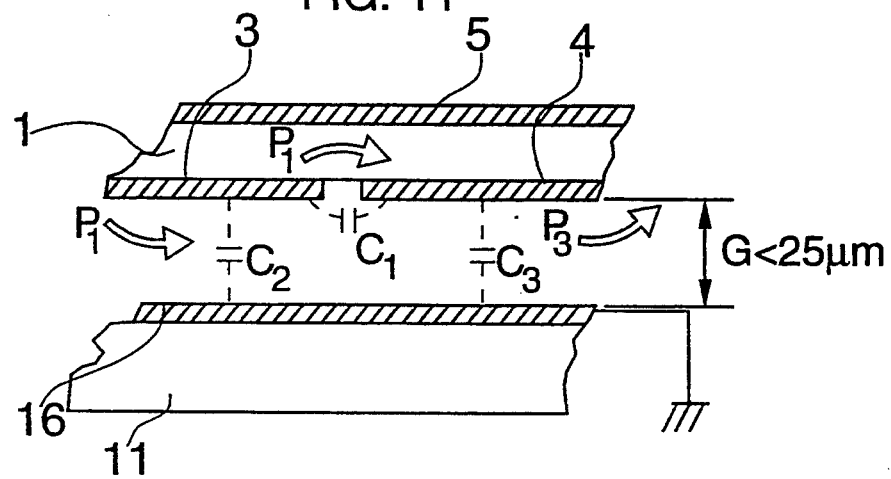
FIG. 11 is an illustration to show the electrical interaction of a crystal plate and an insulating substrate when the distance between them is less than 25 $\mu$m.

Referring now to FIG. 11, as the distance G decreases below 25 μm, capacitance $C_2$ between first input electrode 3 and shield electrode 16, and capacitance $C_3$ between first output electrode 4 and shield electrode 16 both increase. These capacitances permit a leak signal $P_2$ to pass from first input electrode 3 to first output electrode 4, and thus degrades the stopband attenuation level.

The same leakage mechanism as illustrated in FIGS. 10 and 11 exists on a path between first input electrode 3 and first output electrode 4 through common electrode 5.

The optimum stopband attenuation level is achieved by setting the distance G to a value providing the minimum bypass signal, approximately 25 μm, and electrically grounding metal lid 10 by connecting metal lid 10 to shield electrode 16.

Returning now to FIG. 7, a plurality of electrodes 20, passing through a through-hole in insulating support 12 provide the electrical grounding connection between metal lid 10 and shield electrode 16. As previously noted, welding ring 13, between electrode 20 and metal lid 10, is of conductive material, and thus provides a necessary pan of the contact. Passing electrode 20 inside insulating support 12 avoids any possibility of accidental grounding contact between electrode 20 and other elements within monolithic crystal filter 110. This certainty could not be achieved if the required connection between metal lid 10 and shield electrode 16 were to be made with wire bonding.

In some applications, it may be acceptable for the thickness of second input electrode 14 and second output electrode 15 to be equal to the thickness of shield electrode 16, whereby the surfaces of these three elements are co-planar. In this case, the distance G is created solely by the thickness of electric conductive adhesive 17. In other applications, the distance G is made up of the difference in thickness of second input and second output electrodes and shield electrode 16, plus the thickness of electric conductive adhesive 17, as shown in FIG. 7.

Shield electrode 16 is preferably a metal plate, but may also be a thick-film or thin-film plating.

Figure 12A:
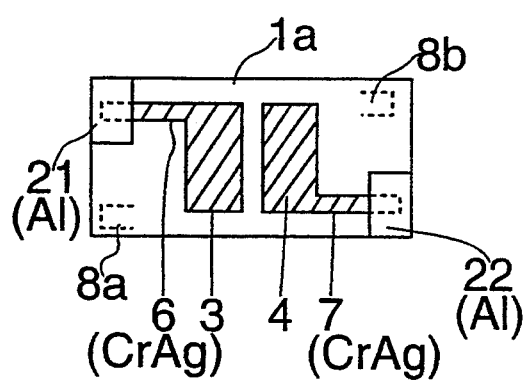
FIG. 12(a) is a plan view of a first surface of a crystal plate of a monolithic crystal filter according to a second embodiment of the present invention.
Figure 12B:
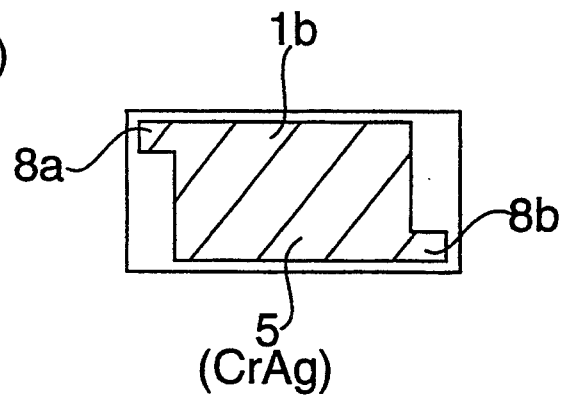
FIG. 12(b) is a plan view of a second surface of the crystal plate of FIG. 12(a).

Referring now to FIGS. 12(a) and 12(b), in a second embodiment of the present invention, electrode terminals 6 and 7 are disposed on first surface 1a of crystal plate 1. Electrode islands 21 and 22 are applied over electrode terminals 6 and 7, respectively for electrical connection therebetween. Electrode islands 21 and 22 are preferably made of aluminum. Electrode terminals, as well as their associated first input electrode 3 and first output electrode 4, are preferably made of a mixture of chromium and silver (Cr—Ag).

Figure 13A:
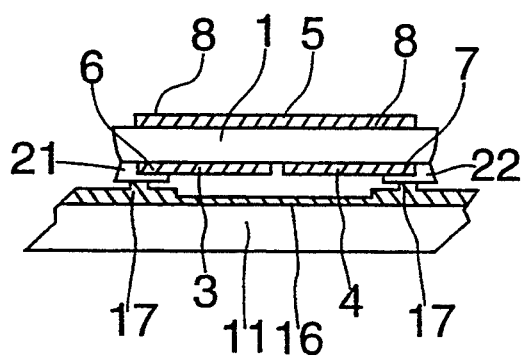
FIG. 13(a) is an enlarged side view of the crystal plate of FIG. 12(a).
Figure 13B:
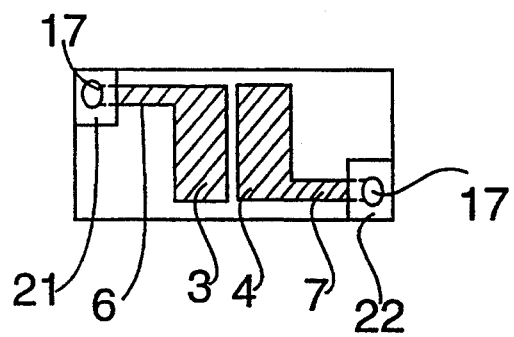
FIG. 13(b) is a plan view of the first surface of the crystal plate of FIG. 12(a) showing the position of an adhesive.

Referring now to FIGS. 13(a) and 13(b), an example of the second embodiment was constructed for measuring the frequency/temperature characteristic. A urethane type electric conductive adhesive is used as adhesive 17. Common electrode 5 is connected by wire bonding to electrode terminal 18 (not shown) of shield electrode 16. In FIG. 13(b), the position of the adhesive 17 is shown by filled circles. In this example, crystal plate 1 had the following dimensions:

| | |
|---|---|
| length | 5 mm, |
| width | 2.5 mm, |
| thickness | 80 μm. |

These dimensions yielded a center frequency $f_0$ of 22 MHz. The test value of attenuation was measured at $f_0$-910 KHz, that is, at a frequency of 21.09 MHz.

Figure 14:
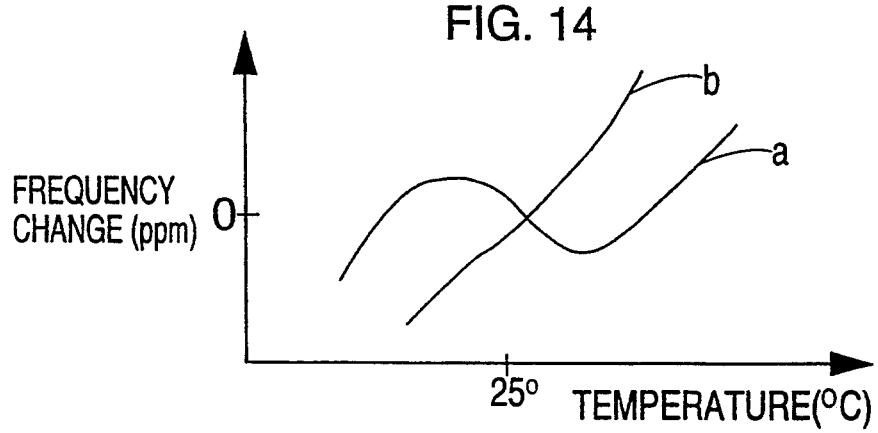
FIG. 14 is a graph to show the difference in a frequency/temperature characteristic between the second embodiment of the present invention and the prior art.

Referring now to FIG. 14 the change in center frequency resulting from changes in temperature of a filter produced by the embodiment of the invention of FIGS. 13(a) and 13(b), is identified by the letter (a). The change in center frequency resulting from changes in temperature in a monolithic crystal filter of the prior art, is identified by the letter (b). It will be noted that frequency-change/temperature curve (a) describes a cubic function (three crossings of a horizontal line), while the prior art frequency change/temperature curve (b) follows a modified linear curve. This effect of center-frequency change versus temperature is most pronounced in a thin crystal plate required for high frequency.

In the prior art, when adhesive 17 sets, friction between crystal plate 1 and electrode terminals 6 and 7 produces a stress on the surface of crystal plate 1. The stress causes the frequency/temperature characteristic to be unstable. However, in the present invention; aluminum electrode islands 21 and 22 are formed over Cr—Ag electrode terminals 6 and 7 of first input and output electrodes 3 and 4. A layer of oxide forms on electrode islands 21 and 22. This layer of oxide provides relaxation of strain and stress between electrode islands 21, 22 and their respective dots of electric conductive adhesive 17. It is believed that this phenomenon is the cause of the improved good frequency/temperature characteristic. The scope of the invention should not be limited by this particular theory.

Figure 15A:
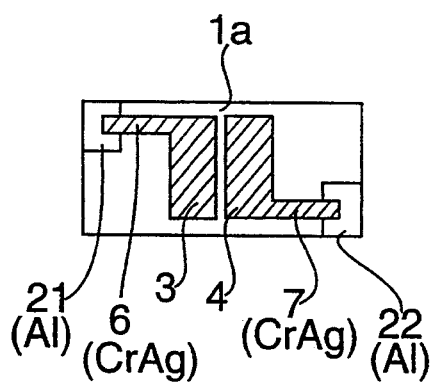
FIG. 15(a) is a plan view of a first surface of the crystal plate of a monolithic crystal filter according to a modification of the second embodiment of the present invention.
Figure 15B:
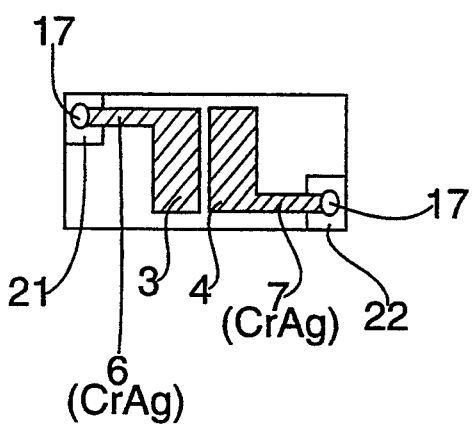
FIG. 15(b) is a plan view of the first surface of the crystal plate of FIG. 15(a).

Referring now to FIGS. 15(a) and 15(b), a modification of the second embodiment includes electrode islands 21 and 22 formed directly on crystal plate 1. Electrode terminals 6 and 7 are then formed over electrode islands 21 and 22. Adhesive 17 is applied in dots over portions of electrode terminals 6 and 7 and electrode islands 21 and 22. This gives direct connection between adhesive 17 and electrode terminals 6 and 7, to prevent degrading the insertion loss of the filter. The bond between electrode terminals 6 and 7 and electrode islands 21 and 22 is improved because electrode terminals 6 and 7 are fixed in place by adhesive 17. Adhesive 17 is a conductive material, thereby providing low ohmic resistance.

Figure 16:
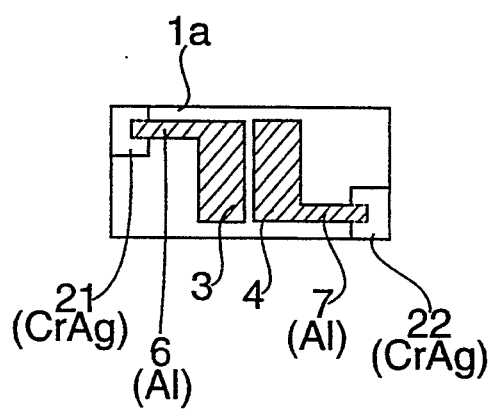
FIG. 16 is a plan view of a first surface of a crystal plate of a monolithic crystal filter according to a further modification of the second embodiment of the present invention.

Referring now to FIG. 16, electrode terminals 6 and 7 may be made of aluminum and electrode islands 21 and 22 made of a Cr—Ag mixture. The formation of aluminum oxide between electrode islands 21 and 22 and electrode terminals 6 and 7 tends to reduce the conductivity between these elements. The degraded conductivity can sometimes be a problem.

Figure 17:
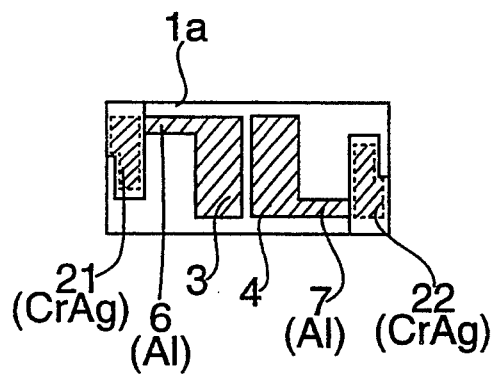
FIG. 17 is a plan view of the first surface of a crystal plate of a monolithic crystal filter according to a still further modification of the second embodiment of the present invention.

Referring now to FIG. 17, the reduced conductivity produced by the formation of aluminum oxide can be compensated by increasing the area of contact between the elements, as shown.

Figure 18:
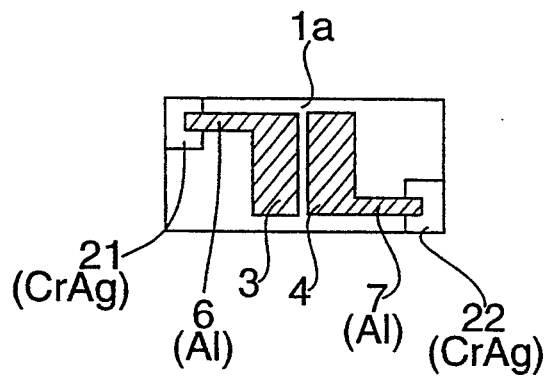
FIG. 18 is a plan view of the first surface of a crystal plate of a monolithic crystal filter according to a further modification of the second embodiment of the present invention.

Referring now to FIG. 18, electrode terminals 6 and 7 of aluminum are formed on electrode islands 21 and 22 of the Cr—Ag mixture. This embodiment of the invention is useful up to high frequencies because of the lightness of aluminum electrode terminals 6 and 7. A center frequency $f_0$ of, for example, 90 MHz may be provided.

Figure 19:
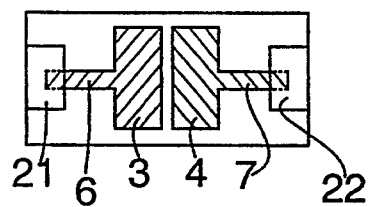
FIG. 19 is a plan view of the first surface of a crystal plate of a monolithic crystal filter according to a still further modification of the second embodiment of the present invention.

Referring now to FIG. 19, a further modification of the invention includes electrode islands 21 and 22 disposed at the center of a surface of crystal plate 1, either over or beneath electrode terminals 6 and 7. The combinations of materials for electrode islands 21 and 22 and electrode terminals 6 and 7, discussed in preceding embodiments, may be employed.

Figure 20A:
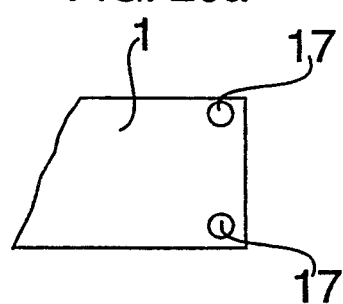
FIG. 20(a) is a plan view to show the position of an adhesive on the crystal plate of a monolithic crystal filter according to a third embodiment of the present invention.
Figure 20B:
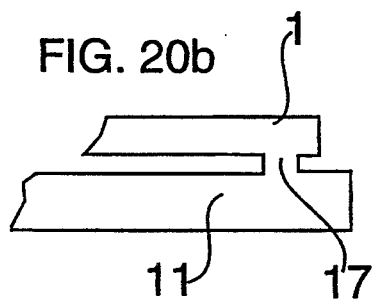
FIG. 20(b) is an enlarged sectional view to show the connection between the crystal plate and the insulating substrate of FIG. 20(a).

Referring now to FIGS. 20(a) and 20(b), a third embodiment of the present invention includes adhesive 17 located at predetermined positions directly on crystal plate 1.

Referring now to FIGS. 20(c) and 20(d), a modification of the third embodiment employs an electrode 23 connected directly to crystal plate with adhesive 17 affixed to the opposite side of electrode 23.

Figure 21A:
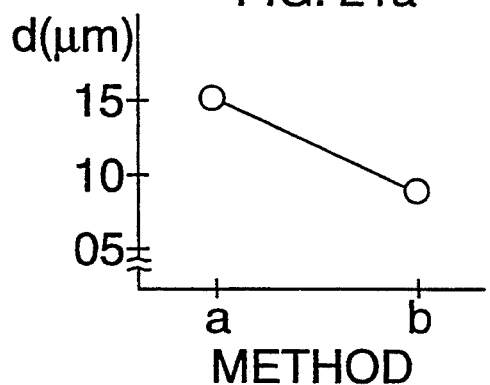
FIG. 21(a) is a graph showing the relationship between a strain (d) and two methods for affixing the crystal plate with adhesive in FIGS. 20(a) and 20(c).
Figure 21B:
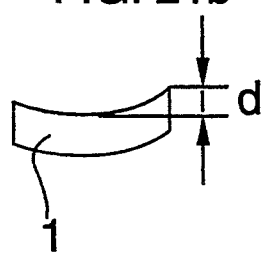
FIG. 21 (b) is an illustration defining the strain d in FIG. 21 (a).

Referring now to FIG. 21(a), a stress (d) in crystal plate 1 of the present invention is indicated by a point (b). The stress in crystal plate 1 of the prior art electrode 23 is indicated by a point (a). Referring now also to FIG. 21(b), the stress is measured by the displacement (d) of one edge of crystal plate 1. It will be noted that the present invention reduces the stress (d) of crystal plate 1 to 65% of its value (a) without electrode It is believed that this reduction in stress occurs because of relaxation that takes place between crystal plate 1 and electrode 23.

The embodiment used to perform the stress tests employed a polyimide adhesive as adhesive 17 in the experiment. An adhesive 17 of urethane may be substituted for the polyimide without departing from the scope of the invention. The closer the two positions of adhesive 17 are located, the larger the stress reduction that results.

Figure 22A:
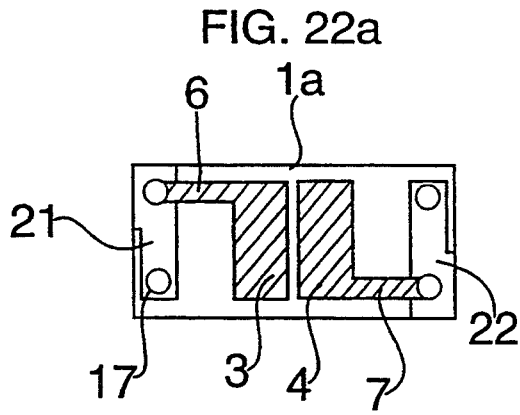
FIGS. 22(a) to 23(b) are plan views of a first surface of the crystal plate in FIG. 20(c).
Figure 22B:
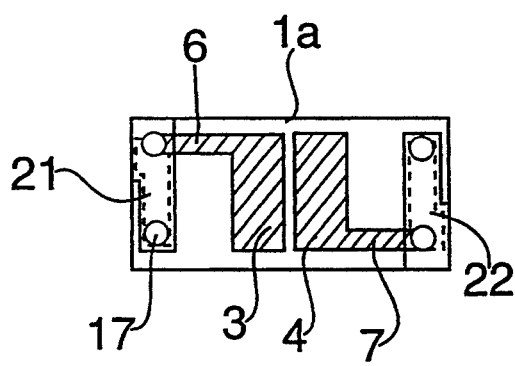

Referring now to FIGS. 22(a) and 22(b) adhesive 17 is affixed at four positions on crystal plate 1. However, the relatively low adhesion of the desirable materials for adhesive 17 may permit electrode islands 21 and 22 to separate from crystal plate 1.

Figure 23A:
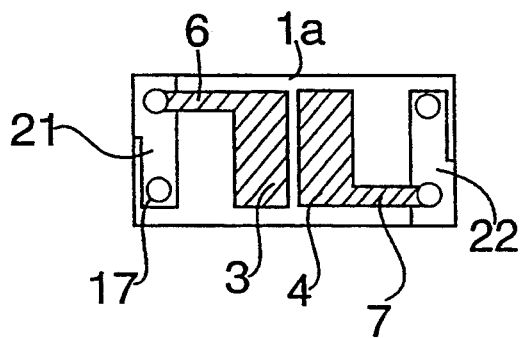
Figure 23B:
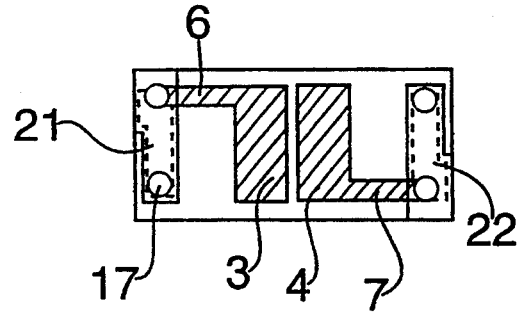

Referring now to FIGS. 23(a) and 23(b), the adhesive separation problems discussed in connection with FIGS. 22(a) and 22(b) is overcome by spreading adhesive 17 to overlap portions of crystal plate 1 and electrode islands 21 and 22. The relaxation prevents breakage by stress at one surface of crystal plate 1, even if adhesive 17 produces stress at the other surface.

Having described preferred embodiments of the invention with reference to the accompanying drawings, it is to be understood that the invention is not limited to the precise embodiments and that various changes and modifications may be affected therein by one skilled in the art without departing from the scope or spirit of the invention which is limited only by the appended claims.

What is claimed is:

1. A monolithic crystal filter comprising:
   a crystal plate;
   a vessel;
   said crystal plate arranged airtight in said vessel;
   said crystal plate having a first input electrode and a first output electrode at a first surface;
   said crystal plate having a common electrode at a second surface;
   said vessel consisting of a main body and a metal lid;
   said main body consisting of an insulating substrate, an insulating support, and a welding ring;
   said insulating substrate having a shield electrode, a second input electrode and a second output electrode at a surface;
   means for electrically connecting said metal lid to said shield electrode; and
   an electric conductive adhesive between said crystal plate and said insulating substrate.

2. A monolithic crystal filter according to claim 1 wherein:
   said first surface of said crystal plate is spaced a predetermined distance from said shield electrode; and
   said predetermined distance being effective to maximize a stopband attenuation level of said filter.

3. A monolithic crystal filter comprising:
   a crystal plate;
   a vessel;
   said crystal plate arranged airtight in said vessel;
   said crystal plate having a first input electrode and a first output electrode on a first surface thereof;
   said crystal plate having a common electrode on a second surface thereof;
   said vessel including a main body and a metal lid;
   said main body including an insulating substrate, an insulating support, and a welding ring;
   said insulating substrate having a shield electrode, a second input electrode and a second output electrode on a surface thereof;
   an electric conductive electrode connected to said shield electrode;
   means for electrically connecting said metal lid to said electric conductive electrode;
   said electric conductive electrode passing through said main body; and
   an electric conductive adhesive between at least one electrode on one of said crystal plate and said insulating substrate, and the other thereof.

4. A monolithic crystal filter according to claim 3 wherein:
   said first surface of said crystal plate is spaced a predetermined distance from said shield electrode; and
   said predetermined distance is selected to produce a maximum stopband attenuation value.

5. A monolithic crystal filter according to claim 4 wherein said predetermined distance is from about 15 to about 50 $\mu$m.

6. A monolithic crystal filter according to claim 3 further comprising:
   a first electrode terminal connected to said first input electrode;
   a second electrode terminal connected to said first output electrode:
   a first electrode island on said first electrode terminal;
   a second electrode island on said second electrode terminal;
   said electric conductive adhesive is disposed between said electrode islands and said insulating substrate;
   said electrode terminals are produced of a different material from that of said electrode islands; and
   one of said electrode terminals and said electrode islands is aluminum.

7. A monolithic crystal filter according to claim 4 wherein:
   said electric conductive adhesive overlaps portions of each of said electrode islands, and of said electric conductive electrodes.

8. A monolithic crystal filter comprising:
   a crystal plate;
   an input electrode on said crystal plate;
   an output electrode on said crystal plate;
   a substrate;
   means for affixing said crystal plate spaced a predetermined distance from said substrate; and
   said means for affixing including means for permitting transverse motion of said crystal plate with respect to said substrate;
   said means for permitting transverse motion includes:
   a first electrode terminal connected to one of said input electrode and said output electrode;
   a first electrode island;
   one of said first electrode terminal and said first electrode island being disposed on said substrate;
   the other of said first electrode terminal and said first electrode island being disposed on said one of said first electrode terminal and said first electrode island; and
   means for producing an appropriate bonding strength between said first electrode terminal and said first electrode island wherein:
   said first electrode terminal and said first electrode island being of different materials;
   at least one of said first electrode terminal and said first electrode island being of a material which develops a lubricating oxide layer; and
   said oxide layer permitting relaxation of stress and strain in a junction between said first electrode terminal and said first electrode island.

9. A monolithic crystal filter comprising:
   a crystal plate;
   an input electrode on said crystal plate;
   an output electrode on said crystal plate;
   a substrate;
   means for affixing said crystal plate spaced a predetermined distance from said substrate; and
   said means for affixing including means for permitting transverse motion of said crystal plate with respect to said substrate;
   said means for permitting transverse motion includes:
   a first electrode terminal connected to one of said input electrode and said output electrode;
   a first electrode island;

one of said first electrode terminal and said first electrode island being disposed on said substrate;

the other of said first electrode terminal and said first electrode island being disposed on said one of said first electrode terminal and said first electrode island; and means for producing an appropriate bonding strength between said first electrode terminal and said first electrode island, said first electrode terminal and said first electrode island being of different materials; at least one of said first electrode terminal and said first electrode island being of a material which develops a lubricating oxide layer; and said oxide layer permitting relaxation of stress and strain in a junction between said first electrode terminal and said first electrode island;

wherein said at least one is made of aluminum.

10. A monolithic crystal filter comprising:
a crystal plate;
an input electrode on said crystal plate;
an output electrode on said crystal plate;
a substrate;
means for affixing said crystal plate spaced a predetermined distance from said substrate; and
said means for affixing including means for permitting transverse motion of said crystal plate with respect to said substrate;
said means for permitting transverse motion includes:
a first electrode terminal connected to one of said input electrode and said output electrode;
a first electrode island;
one of said first electrode terminal and said first electrode island being disposed on said substrate;
the other of said first electrode terminal and said first electrode island being disposed on said one of said first electrode terminal and said first electrode island; and means for producing an appropriate bonding strength between said first electrode terminal and said first electrode island, said first electrode terminal and said first electrode island being of different materials; at least one of said first electrode terminal and said first electrode island being of a material which develops a lubricating oxide layer; and said oxide layer permitting relaxation of stress and strain in a junction between said first electrode terminal and said first electrode island; wherein said different materials include aluminum and a mixture of chromium and silver.

11. A monolithic crystal filter comprising:
a crystal-plate;
a shield electrode;
means for supporting said crystal plate a predetermined distance from said shield electrode;
an insulating support surrounding said crystal plate;
a metal lid over said crystal plate;
at least one electrode passing through a through-hole in said insulating support; and
said at least one electrode connecting said shield electrode to said metal lid.

12. Apparatus according to claim 11, further comprising:
a welding ring securing said metal lid on said insulating support;
said at least one electrode contacting said welding ring; and
said welding ring being conductive, whereby electrical connection is made between said at least one electrode and said metal lid.

* * * * *